United States Patent [19]

Ienaka et al.

[11] 4,030,035
[45] June 14, 1977

[54] CIRCUIT FOR PREVENTING OUTPUT CLIPPING OF R.F. STAGE IN RADIO RECEIVER

[75] Inventors: Masanori Ienaka, Fuchu; Yasuo Kominami, Kokubunji; Yukio Suzuki, Hinode; Masami Kawamura, Kodaira, all of Japan

[73] Assignee: Hitachi, Ltd., Japan

[22] Filed: Sept. 29, 1975

[21] Appl. No.: 617,638

[30] Foreign Application Priority Data

Oct. 2, 1974    Japan ............................. 49-112786

[52] U.S. Cl. ................. 325/404; 325/319; 325/405
[51] Int. Cl.² .......................................... H04B 1/16
[58] Field of Search .......... 325/319, 326, 397, 400, 325/404, 405, 407–409, 411; 330/26, 29

[56] References Cited
UNITED STATES PATENTS

| | | | |
|---|---|---|---|
| 2,897,353 | 7/1959 | Schweiss | 325/319 |
| 3,089,087 | 5/1963 | Birkenes | 325/400 |
| 3,233,177 | 2/1966 | Stone | 325/400 |
| 3,600,684 | 8/1971 | Cherry | 325/400 |
| 3,895,299 | 7/1975 | Tiedeman, Jr. | 325/400 |

Primary Examiner—Benedict V. Safourek
Assistant Examiner—Jin F. Ng
Attorney, Agent, or Firm—Craig & Antonelli

[57] ABSTRACT

In a receiver comprising a radio frequency amplifier stage, a frequency converter stage, an intermediate frequency amplifier stage and a detector, so that the gains of the radio frequency amplifier stage and the intermediate frequency amplifier stage are automatically controlled by an AGC voltage derived from the detector, the improvement further comprising a voltage comparator which compares a signal amplitude value of the radio frequency amplifier stage and a predetermined reference value and which provides a detection output signal when the former value becomes greater than the latter value, the gain of the radio frequency amplifier stage being reduced by the detection output signal so as to prevent the output clipping of the radio frequency amplifier stage.

6 Claims, 15 Drawing Figures

CIRCUIT FOR PREVENTING OUTPUT CLIPPING OF R.F. STAGE IN RADIO RECEIVER

FIELD OF THE INVENTION

This invention relates to a receiver, and more particularly to an AM radio receiver.

DESCRIPTION OF THE PRIOR ART

Figure 1:
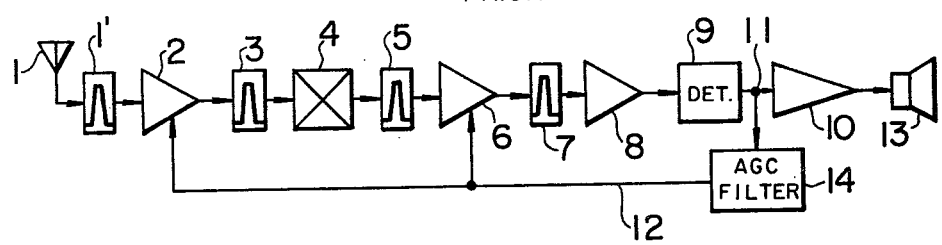
FIG. 1 is a system block diagram which shows an AM radio receiver having heretofore been well known.

An AM radio receiver having heretofore been well known is made up of system blocks shown in FIG. 1. AM radio frequency signal waves having frequencies of 530–1620 KHz and transmitted from a broadcasting station are received by an antenna 1, and are applied to the input of an RF (radio frequency) amplifier stage 2 through an interstage frequency selector element 1'. After being amplified by the amplifier stage 2, the electric waves are applied to a frequency converter stage 4 through an interstage frequency selector element 3. Within the frequency converter stage 4, a local oscillation signal at a frequency which is higher by an intermediate frequency than a frequency at the RF stage is generated, and the local oscillation signal and the radio frequency signal are mixed to produce an intermediate frequency signal of 262.5 KHz or 455 KHz. The intermediate frequency signal is fed through an interstage frequency selector element 5, and is amplified by a first intermediate frequency amplifier stage 6. Further, it is fed through an interstage frequency selector element 7 and amplified by a second intermediate frequency amplifier stage 8, whereupon it is applied to a voice and AGC detection stage 9. An aural signal 11 is produced from the detection stage 9, it is applied to a voice amplifier stage 10 and it is transferred to a loudspeaker 13. Simultaneously therewith, the aural signal 11 is applied to an AGC filter 14. The AGC filter 14 smooths the aural signal 11 and generates an AGC voltage 12. The AGC voltage 12 automatically controls the gains of the RF amplifier stage 2 and the first intermediate frequency amplifier stage 6.

Figure 2:
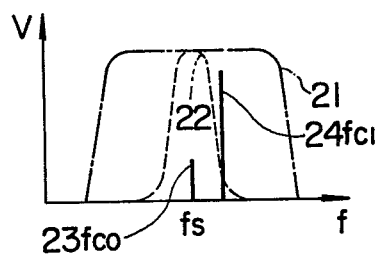
FIG. 2 is a diagram which shows frequency band characteristics and received signals at stages of the receiver shown in FIG. 1.

Referring to FIG. 2, where such well-known AM radio receiver concurrently receives electric waves of a broadcasting station being low in the field intensity and desired to listen to, namely, a feeble-input desired signal 23, and electric waves having a frequency $f_{ct}$ close to the frequency $f_{co}$ of the signal 23, being high in the field intensity and not desired to listen to, namely, an intense-input jamming signal 24, a band characteristic 22 at the detection stage 9 becomes a very narrow frequency band under the actions of the interstage frequency selector elements 1', 3, 5 and 7. Therefore, only the component of the desired signal and the component of a part of the jamming signal are obtained. In consequence, whereas the intense-input jamming signal is received, the AGC voltage has a small value. The gain of the RF amplifier stage 2 is accordingly controlled to be large.

On the other hand, a band characteristic 21 at the RF amplifier stage 2 is a wider frequency band in comparison with the band characteristic 22 at the detection stage 9. The RF amplifier stage 2 therefore amplifies the feeble-input desired signal 23 and also amplifies the intense-input jamming signal 24 largely. The output signal of the RF amplifier stage 2 is consequently clipped. The output clipping of the RF amplifier stage 2 arises also in case where the receiver is detuned from electric waves of a broadcasting station desired to listen to and being high in the field intensity, namely, an intense-input desired signal.

When the output clipping of the RF amplifier stage 2 arises, an overshoot waveform is produced. In some cases, the RF amplifier stage oscillates to render the circuit operation unstable on account of, for example, the positive feedback of a high-frequency signal component contained in the overshoot waveform.

Figure 4A:
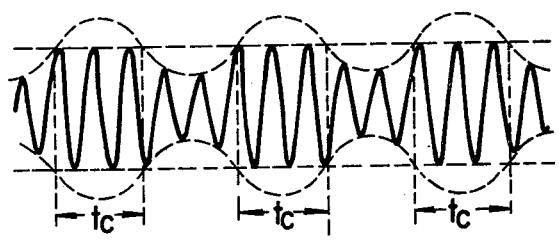
Figure 4B:
Figure 4C:

In a period $t_c$, as illustrated in FIG. 4$a$, in which the output signal of the intense-input jamming signal of the RF amplifier stage is clipped, the feeble-input desired signal being normal as shown in FIG. 4$b$ is suppressed and undergoes the cross modulation as depicted in FIG. 4$c$. Thus, an unpleasant sound is given forth, which is offensive in the sense of hearing.

Figure 3:
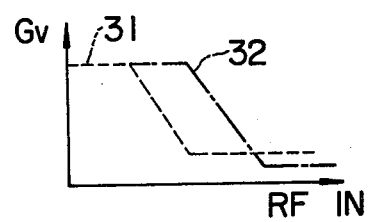
FIG. 3 is a diagram which shows the characteristics of gain changes of an RF amplifier stage and an IF amplifier stage of the receiver in FIG. 1 as responsive to a change in the received field intensity, FIGS. 4 $a$, 4 $b$ and 4 $c$ are waveform diagrams which show an intense-input jamming signal, a normal feeble-input desired signal and a suppressed feeble-input desired signal, respectively.

In order to prevent the output clipping of the RF amplifier stage from occurring easily, design has hitherto been made so that, as illustrated in FIG. 3, the gain 31 of the RF amplifier stage is first reduced upon rise of the received field intensity RF IN, the gain 32 of the IF amplifier stage being thereafter reduced. This measure, however, cannot prevent the output clipping of the RF amplifier stage in the case where the feeble-input desired signal and the intense-input jamming signal are received at the same time. Another problem is that a high S/N ratio (signal-to-noise ratio) is not attainable for a reason as stated below. Since the gain of the RF amplifier stage 2 is first controlled in response to the received field intensity change (fading) of the desired signal, the bias current of a semiconductor amplifier element, such as transistor, within the RF amplifier stage is largely controlled, so that much noises are generated from the element and are greatly amplified by the IF amplifier stage.

Figure 5:
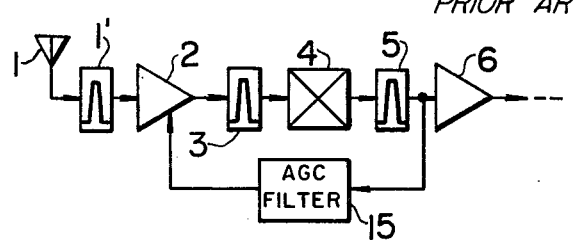
FIGS. 5 and 6 are system block diagrams each of which shows essential portions of a known receiver.

In Japanese patent application publication No. 5629/1959 entitled "Automatic gain regulator circuit of a receiving set," there has been proposed a system for preventing the cross modulation in which, as shown in FIG. 5, the gain of the RF amplifier stage 2 is controlled by obtaining the AGC voltage from the input of a stage of wide frequency band, for example, the first intermediate frequency amplifier stage 6 by means of an AGC detection stage 15. In such system, however, the gain of the RF amplifier stage 2 is first controlled in response to the received field intensity change of the desired signal, and hence, no high S/N ratio cannot be attained. Moreover, since the gain of the RF amplifier stage 2 changes due to a fluctuation in the field intensity of the jamming signal, the level of the desired signal fluctuates to give rise to the cross modulation and to offend the ear. A further disadvantage is that, since the AGC detection stage 15 separate from the voice detection stage 9 is required, the number of circuit components increases. In case of fabricating such AM radio receiver into a monolithic semiconductor integrated circuit device, the number of components to be externally mounted increases.

Even when the AGC voltage is derived from the output of the first intermediate frequency amplifier stage 6, it is obtained from a signal component of narrow frequency band due to the interstage frequency selector elements 3 and 5. It is therefore impossible to prevent the output clipping of the RF amplifier stage in the case where both the feeble-input desired signal and the intense-input jamming signal are received.

Figure 6:
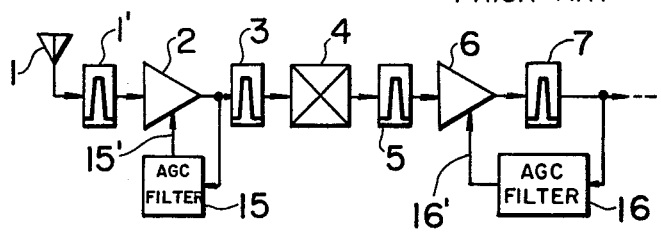
Figure 7:
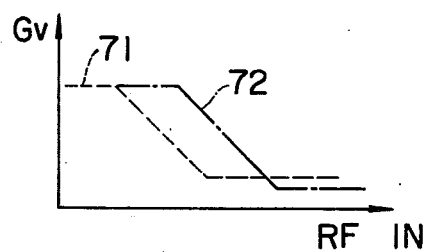
FIGS. 7 and 8 are diagrams each of which shows the characteristics of gain changes of an RF amplifier stage and an IF amplifier stage of the receiver in FIG. 6 as responsive to a change in the received field intensity.

Japanese Utility Model application publication No. 24888/1972 entitled "Automatic gain control device of a superheterodyne receiver" has proposed a system for preventing the cross modulation in which, as illustrated in FIG. 6, the gain of the RF amplifier stage 2 is controlled by deriving an AGC voltage 15' from the output of the RF amplifier stage 2 by means of the AGC detection stage 15, while the gain of the first intermediate frequency amplifier stage 6 is controlled by deriving an AGC voltage 16' from the output of the first intermediate frequency amplifier stage 6 by means of an AGC detection stage 16. Such system, however, is susceptible to the tolerances of the voltage gains of the RF amplifier stage 2 and the first intermediate frequency amplifier stage 6, the tolerance of the gain control sensitivity of the RF amplifier stage 2 to the AGC voltage 15', and the tolerance of the gain control sensitivity of the first intermediate frequency amplifier stage 6 to the AGC voltage 16'. If, as the result, as illustrated in FIG. 7 upon rise of the received field intensity RF IN of the desired signal the reduction of the voltage gain 72 of the RF amplifier stage begins before the voltage gain 71 of the first intermediate frequency amplifier stage is fully reduced, then the S/N ratio will be degraded.

Figure 8:
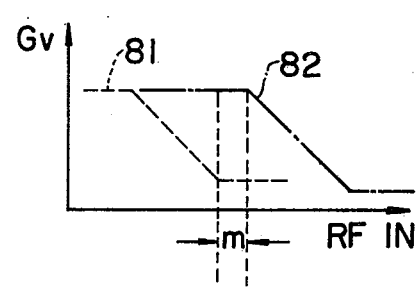
Figure 9:
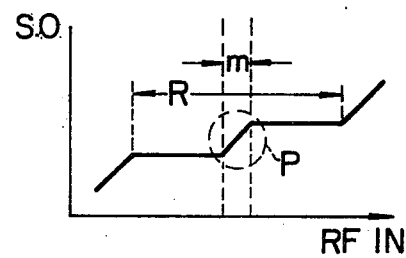
FIG. 9 is a diagram which shows an aural output voltage change versus the received field intensity change as based on the gain change characteristic shown in FIG. 8.

In order to prevent such degradation of the S/N ratio, the turndown characteristics of the first intermediate frequency amplifier stage and the RF amplifier stage may be endowed with an operation margin $m$ as illustrated in FIG. 8 so that, upon the rise of the received field intensity RF IN of the desired signal, the reduction of the voltage gain 82 of the RF amplifier stage may start after the perfect reduction of the voltage 81 of the first intermediate frequency amplifier stage. Since, however, no gain control is conducted in the range of the operation margin $m$, a step P arises in the desired signal field intensity variation (RF IN) — sound output voltage variation (S. O) characteristic as illustrated in FIG. 9. For this reason, a constant sound output is not produced in a predetermined range R of the received field intensity variation.

SUMMARY OF THE INVENTION

This invention has been made in order to solve the problems of the prior art as described above. The objects of the invention are as listed below.

1. To prevent the output signal of an RF amplifier stage from being clipped in case where a receiving set is detuned from an intense-input desired signal.
2. To prevent the output signal of an RF amplifier stage from being clipped in case where a receiving set receives a feeble-input desired signal and an intense-input jamming signal having a frequency close to that of the feeble-input desired signal.
3. To better the S/N ratio of a receiving set.
4. To acquire a detection output which is constant over a predetermined field intensity variation of a desired signal.
5. To prevent the generation of an unpleasant cross-modulation sound ascribable to the output clipping of an RF amplifier stage.
6. To prevent the oscillation of an RF amplifier stage as ascribable to the output clipping of the RF amplifier stage.
7. To prevent the output clipping of an RF amplifier stage without using any separate AGC detector in case where a receiver is detuned from an intense-input desired signal or where it receives both a feeble-input desired signal and an intense-input jamming signal.

The fundamental construction of this invention for accomplishing such objects is characterized by comprising an RF amplifier stage, a frequency converter stage, IF amplifier stages, a detector, and a voltage comparator for the comparison detection between a signal amplitude value and a reference value of the RF amplifier stage, so that where the signal amplitude value of the RF amplifier stage becomes below the reference value, the gain of the RF amplifier stage is reduced by a detection output signal of the voltage comparator, whereby the output clipping of the RF amplifier stage is prevented.

PREFERRED EMBODIMENTS OF THE INVENTION

Hereunder this invention will be described in detail along the preferred embodiments thereof.

Figure 10:
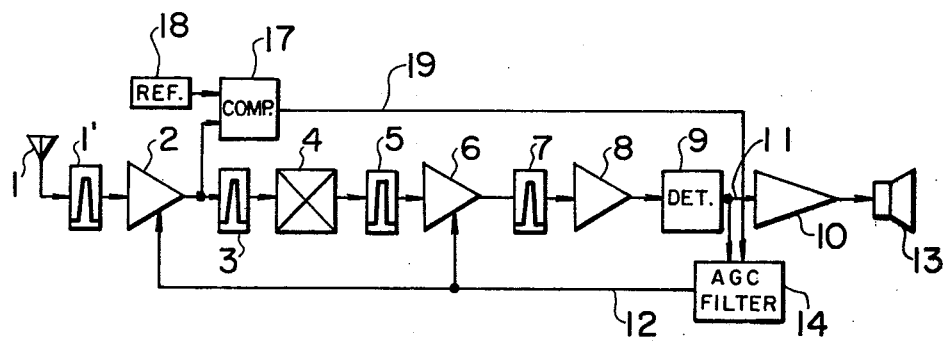
FIG. 10 is a system block diagram which shows an AM radio receiver embodying this invention.

FIG. 10 is a system block diagram which shows an embodiment of the AM radio receiver according to this invention. Reference numeral 1 designates an antenna, 1' an interstage frequency selector element, 2 an RF amplifier stage, 3 an interstage frequency selector element, 4 a frequency converter stage, 5 an interstage frequency selector element, 6 a first intermediate frequency amplifier stage, 7 an interstage frequency selector element, 8 a second intermediate frequency amplifier stage, 9 a voice and AGC detector stage, 10 a voice amplifier stage, 13 a loudspeaker, 14 an AGC filter, 17 a voltage comparator, and 18 a reference voltage source.

In the AM radio receiver of the embodiment, the gain control sensitivities of the RF amplifier stage 2 and the first intermediate frequency amplifier stage 6 to an AGC voltage 12 are respectively set as shown in FIG.

11 so that when the received field intensity of a desired signal rises, the gain 112 of the first intermediate frequency amplifier stage 6 may be earlier reduced along a line $a - b$, and that when the received field intensity rises more, the gain 111 of the RF amplifier stage 2 may be reduced along a line $c - d$ and further along a line $e - f$. When a signal of still higher received field intensity is received and the clipping of the output signal of the RF amplifier stage is going to take place, the voltage comparator 17 makes a comparison between the reference value of the reference voltage source 18 and the amplitude value of the output signal of the RF amplifier stage 2 and produces a detection output signal 19. With the detection output signal 19, the gain 112 of the first intermediate frequency amplifier stage 6 and the gain 111 of the RF amplifier stage 2 are respectively reduced as shown at $a - b$ and at $c - d$ and $e - f$ in FIG. 11.

Concretely, as illustrated in FIG. 10, the detection output signal 19 of the voltage comparator 17 is applied to the AGC filter 14 and is thus smoothed. It is fed through the usual AGC path, to reduce the gains of the first intermediate frequency amplifier stage 6 and the RF amplifier stage 2.

Figure 13:
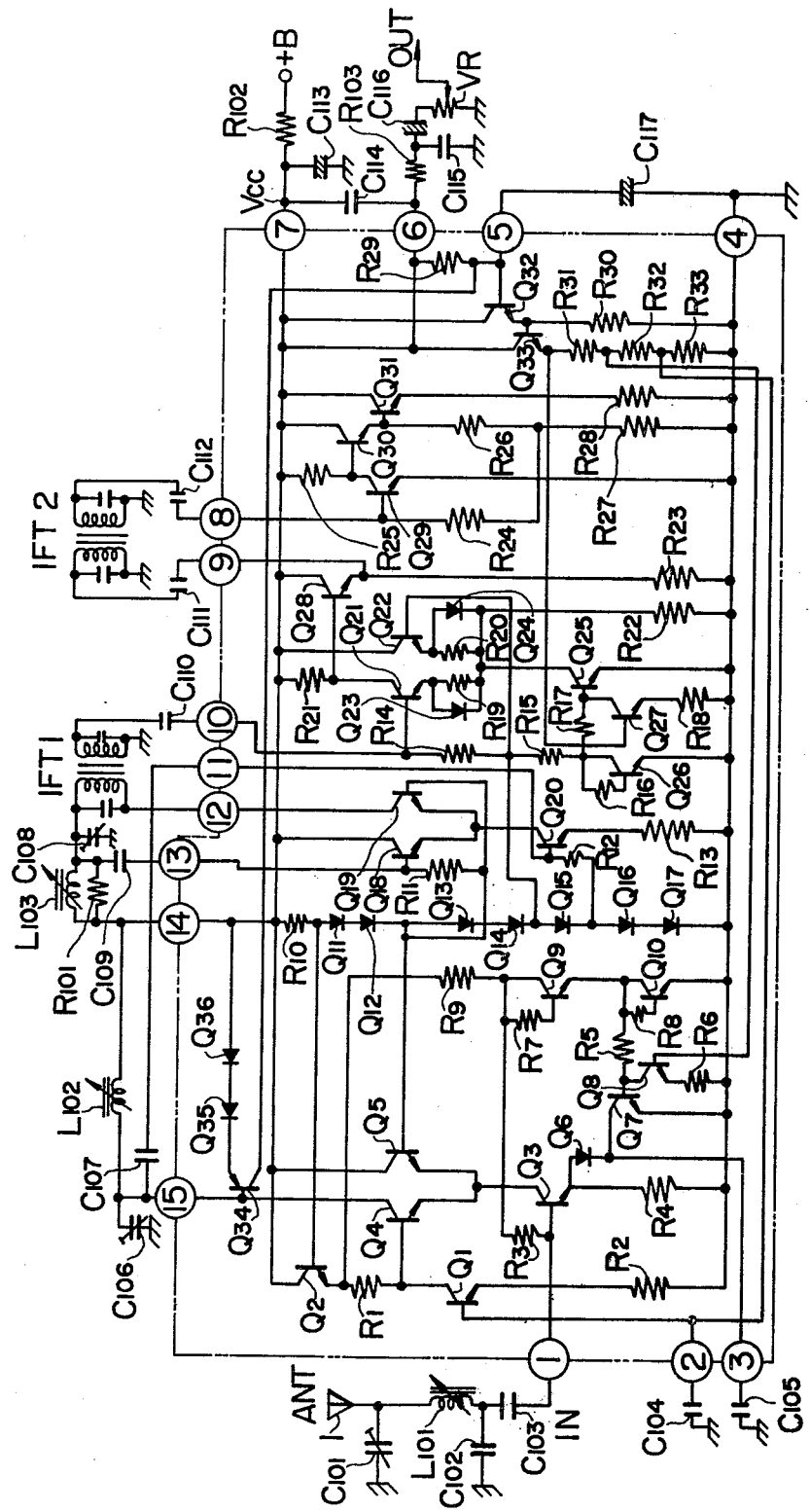
FIG. 13 is a circuit diagram of an embodiment in which the system blocks shown in FIG. 10 are applied to a monolithic semiconductor integrated circuit device.

FIG. 13 is a circuit diagram showing an embodiment in which the system blocks illustrated in FIG. 10 are applied to a monolithic semiconductor integrated circuit device. All circuit elements inside a broken line are formed within a single silicon chip by a well-known process of manufacture. Numerals enclosed with circles indicate Nos. of pins of the integrated circuit. All circuit elements outside the broken line as electrically connected with the pins are discrete components, and they constitute an externally-mounted network of the integrated circuit.

Referring to FIG. 13, electric waves received by the antenna 1 are applied to pin No. 1 through the interstage frequency selector element consisting of capacitors $C_{101}$, $C_{102}$ and $C_{103}$ and a coil $L_{101}$. The RF signal applied to pin No. 1 is amplified by a grounded-emitter transistor $Q_3$ and further a grounded-base transistor $Q_4$ in the RF amplifier stage, and an RF output signal is obtained from pin No. 15. The interstage frequency selector element consisting of a capacitor $C_{106}$ and a coil $L_{102}$ is connected to pin No. 15. The RF signal derived from pin No. 15 is applied through a capacitor $C_{107}$ to pin No. 11, and is further applied to the base electrode of a transistor $Q_{20}$ in the frequency converter stage. Transistors $Q_{18}$ and $Q_{19}$ constitute a local oscillator in the frequency converter stage. The local oscillation frequency of the local oscillator is determined by circuit elements $L_{103}$, $C_{108}$ and $C_{109}$ which are externally attached to pins Nos. 12, 13 and 14. The RF signal and the local oscillation signal are subjected to the frequency mixing within the frequency converter stage, and an intermediate frequency signal is provided from the collector of the transistor $Q_{19}$ or pin No. 12. The intermediate frequency signal derived from pin No. 12 is applied to pin No. 10 through a first intermediate frequency transformer IFT1 as well as a capacitor $C_{110}$. It is amplified by amplifying transistors $Q_{21}$ and $Q_{28}$ of the first intermediate frequency amplifier stage, and the amplified signal is taken out to pin No. 9. The intermediate frequency signal derived from pin No. 9 is applied to pin No. 8 through a second intermediate frequency transformer IFT2 and capacitors $C_{111}$ and $C_{112}$. After being amplified by transistors $Q_{29}$ and $Q_{30}$ of the second intermediate frequency amplifier stage, it is applied to the base electrode of a detecting transistor $Q_{31}$ of the voice and AGC detector stage. The intermediate frequency signal is AM-detected by the base-emitter circuit of the detecting transistor $Q_{31}$ and a resistance $R_{28}$ and a capacitor $C_{114}$ which are connected to the emitter of the transistor $Q_{31}$. An aural signal is derived from pin No. 6, and it is transferred to the voice amplifier stage and the loudspeaker although not shown.

The aural signal derived from pin No. 6 is smoothed by the AGC filter which is composed of a resistance $R_{29}$ connected to pins Nos. 5 and 6 and a capacitor $C_{117}$ connected to pins Nos. 4 and 5. The smoothed signal is fed via an emitter follower circuit $Q_{32}$ and $Q_{33}$, and the AGC voltage is obtained from the emitter of the transistor $Q_{33}$. A network which is constructed of a P-N-P type transistor $Q_{34}$ and diodes $Q_{35}$ and $Q_{36}$ connected between pin No. 14 and pin No. 15 builds up the voltage comparator. The detection output signal of the voltage comparator is acquired from the collector of the P-N-P transistor $Q_{34}$. It is applied to one end of the capacitor $C_{117}$ constituting the AGC filter, that is, to pin No. 5.

On the other hand, voltage divider resistances of three resistances $R_{31}$, $R_{32}$ and $R_{33}$ are connected between the emitter electrode of the transistor $Q_{33}$ and a ground potential point. Thus, the gain control sensitivities of the RF amplifier stage and the first intermediate frequency amplifier stage to the common AGC voltage are respectively held set. In response to the rise of the received field intensity, i.e., the rise of the AGC voltage, the degree of conduction of a controlling transistor $Q_{27}$ of the first intermediate frequency amplifier stage increases. The degree of conduction of a variable current transistor $Q_{25}$ is consequently lowered, so that the emitter currents of amplifying transistors $Q_{21}$ and $Q_{22}$ decrease. Therefore, such emitter currents having flowed through diodes $Q_{23}$ and $Q_{24}$ in large amounts diminish and begin to flow through resistances $R_{19}$ and $R_{20}$. Then, the gain 112 of the first intermediate frequency amplifier stage lowers as depicted at $a - $ to $b$ in FIG. 11. As regards the details of such circuit operation, refer to Japanese patent application No. 9349/1971 (Japanese patent application public-disclosure No. 22655/1972) entitled "Amplifier circuit." When the received field intensity rises still more, the potential of the juncture between the voltage divider resistances $R_{31}$ and $R_{32}$ rises, and the degree of conduction of a controlling transistor $Q_8$ of the RF amplifier stage increases. Thus, the degree of conduction of a controlling transistor $Q_7$ begins to lower. Also the degree of conduction of a diode $Q_6$ lowers. In this way, while the diode $Q_6$ is conductive, the emitter electrode of the amplifying transistor $Q_3$ of the RF amplifier stage is grounded AC-wise by a capacitor $C_{105}$ connected to pin No. 3, and hence, the amplifying transistor $Q_3$ is set at a high gain state. When the degree of conduction of the diode $Q_6$ lowers, the conduction resistance increases, and the gain of the amplifying transistor $Q_3$ becomes dependent upon an emitter resistance $R_4$. Then, the gain 111 of the RF amplifier stage lowers as depicted at $c - d$ in FIG. 11. When the received field intensity rises yet more, the voltage of the juncture between the voltage divider resistances $R_{32}$ and $R_{33}$ rises, and the collector potential of a controlling transistor $Q_1$ of the RF amplifier stage lowers. In this way, under the state under which the collector potential of the controlling transistor $Q_1$ is high, the amplifying transistor $Q_4$ of the RF amplifier stage is conductive and an amplifying transistor $Q_5$ is nonconductive. Therefore, the RF signal current flowing through the amplifying transistor $Q_3$ flows through the amplifying transistor $Q_4$ for the most part, and the RF amplifier stage is set at a high gain state. In contrast, when the collector potential of the controlling transistor $Q_1$ lowers, the amplifying transistor $Q_4$ becomes nonconductive and the amplifying transistor $Q_5$ becomes conductive. Then, the gain 111 of the RF amplifier stage lowers as depicted at $e - f$ in FIG. 11.

According to the embodiment of this invention as explained above, the various objects intended can be accomplished for reasons to be stated below. 1., 2.: When the output amplitude value of the RF amplifier stage 2 becomes greater than a predetermined value due to the detuning of the receiving set from the desired intense-input signal or to the simultaneous reception of the feeble-input desired signal and the intense-input jamming signal, the voltage comparator 17 operates to supply the detection output signal 19 to the AGC filter 14, so that the gain of the RF amplifier stage 2 is reduced. Therefore, the output amplitude value of the RF amplifier stage 2 becomes small, and the output clipping is preventable.

This will be described more in detail with reference to FIG. 13. The D.C. level of the RF output signal derived from pin No. 15 is equal to the voltage of pin No. 7, that is, supply voltage $V_{cc}$. The RF output signal swings with respect to the D.C. level. Now, let $V_{cc}$ denote the voltage of pin No. 15 (equal to the supply voltage of pin No. 7), $V_F$ denote the forward voltage of the diode $Q_{35}$ as well as $Q_{36}$, and $V_{BE}$ denote the base-emitter forward voltage of the P-N-P transistor $Q_{34}$. When the lowermost value of the RF output signal becomes smaller than $V_{cc} - 2 V_F - V_{BE}$, the diodes $Q_{35}$ and $Q_{36}$ and the P-N-P transistor $Q_{34}$ are rendered conductive, and the detection output signal current flows through the collector of the P-N-P transistor $Q_{34}$. That is, when the amplitude value of the output signal of the RF amplifier stage becomes greater than $2 V_F + V_{BE} \approx 2.1$ volts, the voltage comparator is actuated to reduce the gain of the RF amplifier stage 2.

Figure 11:
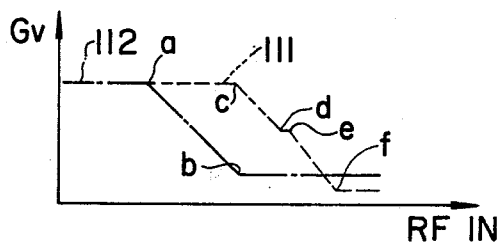
FIG. 11 is a diagram which shows the characteristics of gain changes of an RF amplifier stage and an IF amplifier stage of the receiver in FIG. 10 versus a change in the received field intensity.

3. In the prior art, the gain 31 of the RF amplifier stage is first reduced in response to the rise of the received field intensity as illustrated in FIG. 3, so that the bias of the RF amplifier stage changes largely and that the noise voltages of transistors in the RF amplifier stage increase. The noise voltages degrades the S/N ratio for such reason that they are greatly amplified by the IF amplifier stages. In contrast, according to this invention, the gain control sensitivities of the RF amplifier stage and the IF amplifier stage are set as illustrated in FIG. 11 so that the gain 112 of the IF amplifier stage may be first reduced in response to the rise of the received field intensity of the desired signal and that the gain 111 of the RF amplifier stage may be reduced for the first time when the received field intensity rises more. Therefore, the S/N ratio of the receiving set can be improved.

4.: Likewise to the receiver having hitherto been well known, this invention controls the gains of the RF amplifier stage and the IF amplifier stage by the common AGC voltage 12. Therefore, when design is made with particular attention to only the gain control sensitivities of the RF amplifier stage and the IF amplifier stage to the common AGC voltage 12, the accurate switchover characteristics of the RF amplifier stage and the IF amplifier stage are attained as depicted in FIG. 11, and the constant detection sound output is achieved.

5., 6.: Since the output clipping of the RF amplifier stage can be prevented for the above reasons (1) and (2), the unpleasant cross-modulation sound can be prevented from occurring and the RF amplifier stage can be prevented from oscillating.

7.: In accordance with one embodiment of this invention, in smoothing the detection output signal of the voltage comparator and controlling the gain of the RF amplifier stage so as to lower, the usual AGC filter and AGC path can be utilized. Therefore, the separate AGC detector is unnecessary.

This invention is not restricted to the foregoing embodiment, but it can adopt aspects of performance as stated below.

1. The intermediate frequency amplifier stage is not restricted to that having the first intermediate frequency amplifier stage and the second intermediate frequency amplifier stage, but it may be made up of a single stage.

2. The RF amplifier stage may be constructed in multistage connection, and the detection of the output clipping of the RF amplifier stage may be made by comparing the amplitude value of an interstage RF signal and the reference value.

Figure 12:
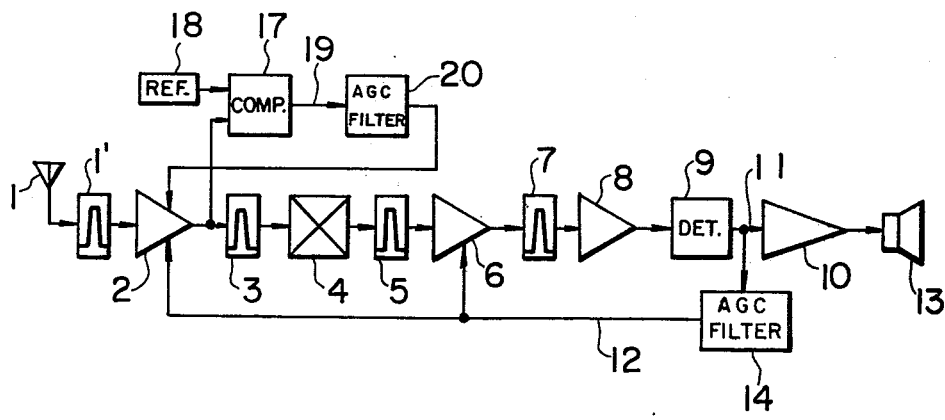
FIG. 12 is a system block diagram which shows another embodiment of the AM radio receiver according to this invention.

3. In smoothing the detection output signal 19 of the voltage comparator 17 and controlling the gain of the RF amplifier stage 2 so as to diminish, a separate AGC detector and AGC filter 20 may be used as shown in FIG. 12. According to such embodiment, the price of the product rises to the amount of the separate AGC detector and AGC filter 20. However, even when the gain of the RF amplifier stage 2 is reduced due to the large jamming signal in case of the simultaneous reception of the feeble-input desired signal and the intense-input jamming signal, the gain of the first intermediate frequency amplifier stage 6 is raised by the usual AGC voltage 12, and hence, the feeble-input desired signal is amplified at a comparatively high gain, so that the desired signal is never suppressed (masked).

This invention is not restricted to the AM radio receiver, but it can be generally applied to receivers having an RF amplifier stage, a frequency converter stage and an IF amplifier stage.

We claim:

1. In a receiver including in cascade a radio frequency amplifier stage, a frequency converter stage, an intermediate frequency amplifier stage and a detector, and AGC filter means for automatically controlling the gains of said radio frequency amplifier stage and said intermediate frequency amplifier stage by an AGC voltage derived from the output of said detector, the improvement comprising voltage comparator means connected to the output of said radio frequency amplifier stage for effecting a comparison detection between the signal amplitude value of the output of said radio frequency amplifier stage and a reference value and for producing a control signal when the signal amplitude value of the output of said radio frequency amplifier stage becomes greater than the predetermined reference value, and means responsive to said control signal to reduce the gain of said radio frequency amplifier stage, thereby to prevent output clipping of said radio frequency amplifier stage.

2. The receiver according to claim 1, wherein interstage frequency selecting means are respectively connected between said radio frequency amplifier stage and said frequency converter stage and between said frequency converter stage and said intermediate frequency amplifier stage.

3. The receiver according to claim 1 wherein said means responsive to said control signal forms part of said AGC filter means the output of which is applied to said radio frequency amplifier stage and said intermediate frequency amplifier stage.

4. The receiver according to claim 3, wherein interstage frequency selecting means are respectively connected between said radio frequency amplifier stage and said frequency converter stage and between said frequency converter stage and said intermediate frequency amplifier stage.

5. The receiver according to claim 1 wherein said means responsive to said control signal comprises AGC detection filter means connected to an output of said voltage comparator the output of which is applied to said radio frequency amplifier stage through said AGC detection filter means.

6. The receiver according to claim 5, wherein interstage frequency selecting means are respectively connected between said radio frequency amplifier stage and said frequency converter stage and between said frequency converter stage and said intermediate frequency amplifier stage.

* * * * *